(12) United States Patent
Jin et al.

(10) Patent No.: US 9,343,302 B2
(45) Date of Patent: May 17, 2016

(54) SILICON GERMANIUM AND GERMANIUM MULTIGATE AND NANOWIRE STRUCTURES FOR LOGIC AND MULTILEVEL MEMORY APPLICATIONS

(71) Applicant: Intel Corporation, Santa Clara, CA (US)

(72) Inventors: Been-Yih Jin, Taipei (TW); Brian S. Doyle, Portland, OR (US); Jack T. Kavalieros, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/571,579

(22) Filed: Dec. 16, 2014

(65) Prior Publication Data
US 2015/0099349 A1    Apr. 9, 2015

Related U.S. Application Data

(60) Continuation of application No. 14/184,999, filed on Feb. 20, 2014, now Pat. No. 8,936,974, which is a continuation of application No. 12/885,071, filed on Sep. 17, 2010, now Pat. No. 8,722,478, which is a division of application No. 11/729,565, filed on Mar. 29, 2007, now Pat. No. 7,821,061.

(51) Int. Cl.
*H01L 21/00* (2006.01)
*H01L 21/02* (2006.01)
*B82Y 10/00* (2011.01)
*H01L 29/06* (2006.01)
(Continued)

(52) U.S. Cl.
CPC ........... *H01L 21/02603* (2013.01); *B82Y 10/00* (2013.01); *H01L 21/0245* (2013.01); *H01L 21/02164* (2013.01); *H01L 21/02236* (2013.01); *H01L 21/02381* (2013.01); *H01L 21/02507* (2013.01); *H01L 21/02532* (2013.01); *H01L 21/30604* (2013.01); *H01L 21/76283* (2013.01); *H01L 29/068* (2013.01); *H01L 29/0665* (2013.01); *H01L 29/0673* (2013.01); *H01L 29/0676* (2013.01); *H01L 29/1054* (2013.01); *H01L 29/165* (2013.01); *H01L 29/42324* (2013.01); *H01L 29/42392* (2013.01); *H01L 29/66439* (2013.01); *H01L 29/66795* (2013.01); *H01L 29/775* (2013.01); *H01L 29/785* (2013.01); *H01L 29/78696* (2013.01); *H01L 21/31658* (2013.01); *H01L 21/823807* (2013.01); *H01L 29/66818* (2013.01)

(58) Field of Classification Search
CPC ................... H01L 21/02603; H01L 21/76283; H01L 21/0238; H01L 21/02532; H01L 21/02507; H01L 21/0245
See application file for complete search history.

(56) References Cited

U.S. PATENT DOCUMENTS 5,596,529 A    1/1997 Noda et al.
5,844,268 A    12/1998 Noda et al.
(Continued)

*Primary Examiner* — Laura Menz
(74) *Attorney, Agent, or Firm* — Winkle, PLLC

(57) ABSTRACT

A method to provide a transistor or memory cell structure. The method comprises: providing a substrate including a lower Si substrate and an insulating layer on the substrate; providing a first projection extending above the insulating layer, the first projection including an Si material and a Si1−xGex material; and exposing the first projection to preferential oxidation to yield a second projection including a center region comprising Ge/Si1−yGey and a covering region comprising SiO2 and enclosing the center region.

5 Claims, 3 Drawing Sheets

(51) Int. Cl.
*H01L 29/165* (2006.01)
*H01L 29/423* (2006.01)
*H01L 29/66* (2006.01)
*H01L 29/775* (2006.01)
*H01L 29/78* (2006.01)
*H01L 29/786* (2006.01)
*H01L 29/10* (2006.01)
*H01L 21/306* (2006.01)
*H01L 21/762* (2006.01)
*H01L 21/316* (2006.01)
*H01L 21/8238* (2006.01)

(56) References Cited

U.S. PATENT DOCUMENTS

| | | | |
|---|---|---|---|
| 6,800,910 B2 | 10/2004 | Lin et al. | |
| 7,005,366 B2 | 2/2006 | Chau et al. | |
| 7,018,876 B2 | 3/2006 | Mathew et al. | |
| 7,193,279 B2 | 3/2007 | Doyle et al. | |
| 7,241,653 B2 | 7/2007 | Hareland et al. | |
| 7,297,600 B2 | 11/2007 | Oh et al. | |
| 7,348,284 B2 | 3/2008 | Doyle et al. | |
| 7,371,627 B1 | 5/2008 | Forbes | |
| 7,439,165 B2 | 10/2008 | Lo et al. | |
| 7,456,476 B2 | 11/2008 | Hareland et al. | |
| 7,479,421 B2 | 1/2009 | Kavalieros et al. | |
| 7,498,609 B2 | 3/2009 | Murofushi et al. | |
| 7,510,954 B1 | 3/2009 | Forbes | |
| 7,525,141 B1 | 4/2009 | Forbes | |
| 7,579,282 B2 | 8/2009 | Rauf et al. | |
| 7,588,977 B2 * | 9/2009 | Suk | H01L 29/0673 257/E29.229 |
| 7,727,830 B2 | 6/2010 | Jin et al. | |
| 7,728,324 B2 * | 6/2010 | Tezuka | H01L 21/823807 257/20 |
| 7,960,794 B2 | 6/2011 | Doyle et al. | |
| 8,679,902 B1 * | 3/2014 | Basker | H01L 29/66439 257/E21.051 |
| 2005/0272192 A1 | 12/2005 | Oh et al. | |
| 2006/0234137 A1 | 10/2006 | Kim | |
| 2008/0001171 A1 * | 1/2008 | Tezuka | H01L 21/823807 257/191 |
| 2008/0029828 A1 | 2/2008 | Oh et al. | |
| 2008/0169512 A1 | 7/2008 | Doyle et al. | |
| 2008/0237575 A1 | 10/2008 | Jin et al. | |
| 2008/0296659 A1 | 12/2008 | Park et al. | |
| 2009/0124097 A1 | 5/2009 | Cheng | |
| 2009/0170251 A1 | 7/2009 | Jin et al. | |
| 2011/0008937 A1 | 1/2011 | Jin et al. | |
| 2011/0084284 A1 * | 4/2011 | Zhang | H01L 29/0623 257/77 |
| 2012/0058619 A1 | 3/2012 | Park et al. | |
| 2012/0309173 A1 | 12/2012 | Shah et al. | |

\* cited by examiner

SILICON GERMANIUM AND GERMANIUM MULTIGATE AND NANOWIRE STRUCTURES FOR LOGIC AND MULTILEVEL MEMORY APPLICATIONS

CROSS-REFERENCE TO RELATED APPLICATION

The present application is a continuation of application Ser. No. 14/184,999 filed on Feb. 20, 2014 which is a continuation of application Ser. No. 12/885,071 filed on Sep. 17, 2010, which is now U.S. Pat. No. 8,722,478 issued on May 13, 2014, which is a division of application Ser. No. 11/729,565 filed on Mar. 29, 2007, which is now U.S. Pat. No. 7,821,061 issued on Oct. 26, 2010.

FIELD

Embodiments of the present invention relate generally to the field of transistor fabrication. In particular, embodiments relate to transistor structures having strained or nanowire channel regions.

BACKGROUND

Transistors and other devices are connected together to form circuits, such as very large scale integrated circuits, ultra-large scale integrated circuits, memory, and other types of circuits. When the size of transistors, for example, is reduced and device compaction is increased, problems may arise concerning parasitic capacitance, off-state leakage, power consumption, and other characteristics of a device. Semiconductors on insulator (SOI) structures have been proposed in an attempt to overcome some of these problems. However, SOI structures generally have a high rate of defects, as it is difficult to produce thin, uniform semiconductor layers in fabrication. Defect problems in SOI structures include defects within a single wafer (e.g., the thickness of a wafer differs at various points on the wafer) and defects from wafer to wafer (e.g., an inconsistent mean silicon layer thickness among SOI wafers). As transistor devices are made smaller, channel length is generally reduced. Reduction in the channel length generally results in an increased device speed, as gate delay typically decreases. However, a number of side effects may arise when channel length is reduced. Such negative side effects may include, among others, increased off-state leakage current due to threshold voltage roll-off (e.g., short channel effects).

One way of increasing device speed is to use higher carrier mobility semiconductor materials to form the channel. Carrier mobility is generally a measure of the velocity at which carriers flow in a semiconductor material under an external unit electric field. In a transistor device, carrier mobility is a measure of the velocity at which carriers (e.g., electrons and holes) flow through or across a device channel in an inversion layer. For example, higher carrier mobility has been found in narrow bandgap materials that include germanium (Ge). Germanium has electron and hole mobility of about 3900 cm2/Vs and about 1900 cm2/Vs, respectively, which are higher than that of electron and hole mobility of silicon, which are 1500 cm2/Vs and 450 cm2/Vs, respectively.

However, disadvantageously, conventional methods of introducing strain in a non-planar transistor channel using recess etch/raised source/drain regions on free standing Si fins have proven difficult. In planar transistor structures, source/drain regions may be provided that have a crystalline material with lattice spacing larger than a lattice spacing of the channel, thus straining the channel. However, in the case of a non-planar transistor channel including a fin, the fin is free standing, and thus inducing the required amount of strain in the fin by virtue of engineering the source/drain region lattice spacing has proven difficult if not impossible.

Another structure for employing a narrow bandgap material for a non-planar transistor is to form one or more nanowires to serve as the channel region. Employing a nanowire as a channel of a transistor tends to yield a transistor having a low power consumption, a high integration degree, a rapid response speed, etc. The semiconductor nanowire indicates a wire having a width of several nanometers to scores of nanometers. However, the nano-technology for manufacturing the transistor has not yet been sufficiently developed. Thus, the formation, assembly and alignment of nanowires according to the prior art has proven difficult. According to the prior art, nanowires may be grown by way of CVD using catalytic nucleation sites for the nanowires. However, disadvantageously, growing nanowires as mentioned above results in nanowire structures that grow randomly, and that, as a result, tend to present random dimensions/placement.

The prior art fails to provide an effective and reliable method to form a strained or nanowire channel region adapted for use on a non-planar transistor.

Figure 1:
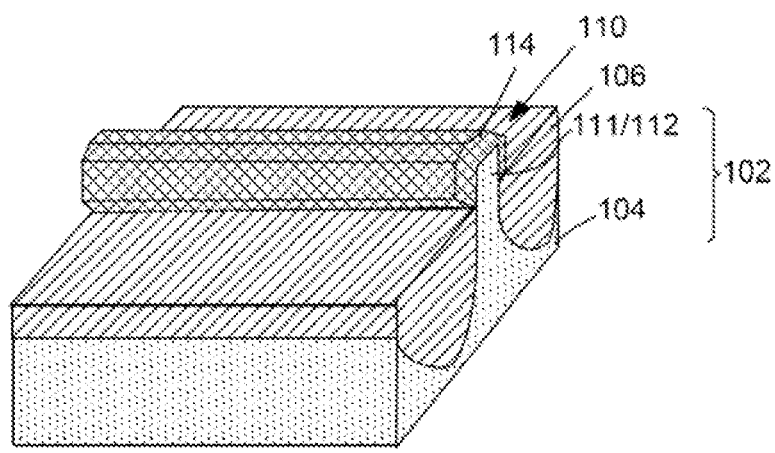
FIG. 1 is a perspective view of a beginning structure from which a transistor structure may be formed according to a first and/or a second method embodiment.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a method to provide a transistor or memory cell structure is disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements. In addition, in the instant description, figures and/or elements may be referred to in the alternative. In such a case, for example where the description refers to FIGS. X/Y showing an element A/B, what is meant is that FIG. X shows element A and FIG. Y shows element B. In addition, a "layer" as used herein may refer to a layer made of a single material, a layer made of a mixture of different components, a layer made of various sub-layers, each sub-layer also having the same definition of layer as set forth above.

Figure 2:
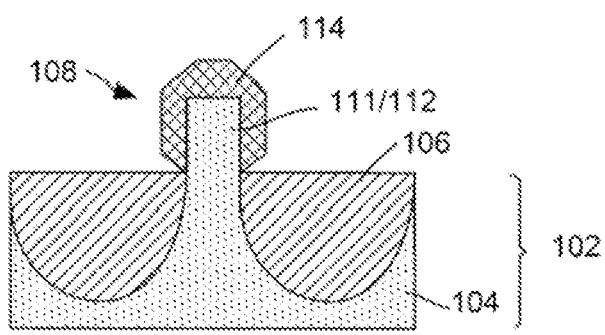
FIG. 2 is a cross sectional view of the structure of FIG. 1.
Figure 6:
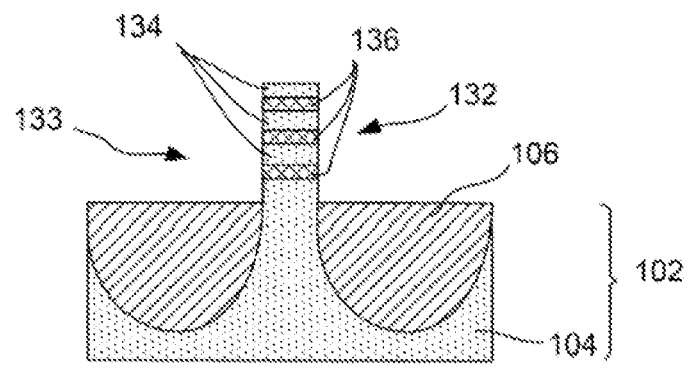
FIG. 6 is a cross-sectional view of a beginning structure from which a transistor/memory cell structure may be formed according to a third method embodiment.
Figure 7:
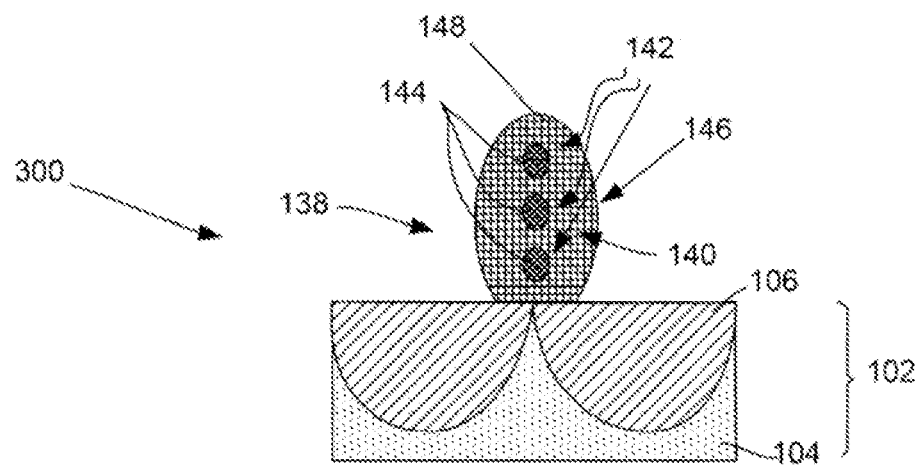
FIG. 7 is a cross-sectional view of a structure resulting from preferential oxidation of the structure of FIG. 6.

Aspects of this and other embodiments will be discussed herein with respect to FIGS. 1-8 below. The figures, however, should not be taken to be limiting, as it is intended for the purpose of explanation and understanding. FIGS. 1-4 show fabrication stages for a transistor structure including a Ge/Si1-yGey fin according to a first embodiment. By "Ge/Si1-yGey" what is meant in the context of the instant description is a crystalline material including either substantially pure Ge, or a crystalline material including a Si1-yGey alloy. FIGS. 1, 2 and 5 show fabrication stages for a transistor structure including a Ge/Si1-yGey floating nanowire channel according to a second embodiment. FIGS. 6 and 7 show fabrication stages for providing multi-level nanowires for a multilevel memory device, or as channels for a multilevel logic device, according to third embodiment. The figures are discussed in further detail below.

Figure 3:
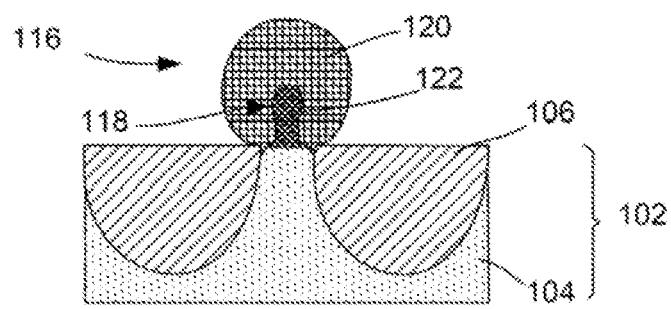
FIG. 3 is a cross sectional view of a structure defining a fin resulting from preferential oxidation of the structure of FIGS. 1/2.
Figure 4:
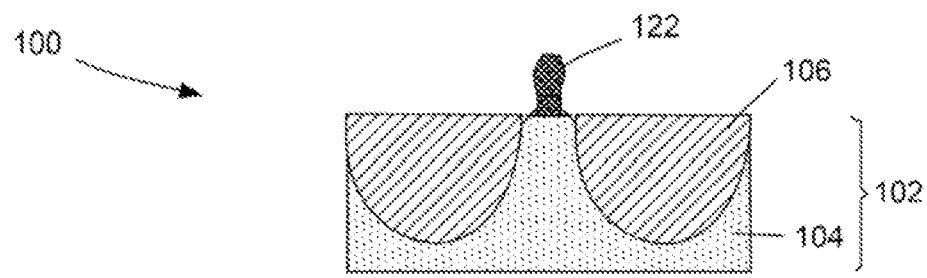
FIG. 4 is a cross sectional view of a structure resulting from a removal from the structure of FIG. 3 of the covering region on the fin.
Figure 5:
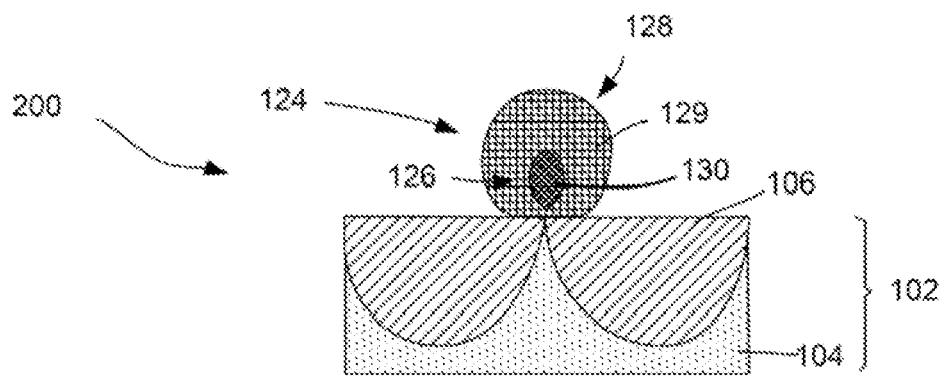
FIG. 5 is a cross sectional view of a structure defining a nanowire resulting from extended preferential oxidation of the structure of FIGS. 1/2.

FIGS. 1 and 2 show initial stages of fabrication of a transistor according to a first embodiment as shown in FIG. 4, and a second embodiment as shown in FIG. 5. shown in FIG. 1. As shown in FIGS. 1 and 2 by way of example, a method according to an embodiment includes providing a substrate 102, including a lower Si substrate, for example lower bulk Si substrate 104 upon which is formed in insulating layer 106, such as a silicon dioxide film. A first projection 108 is formed above insulating layer 106, the first projection including a Si material 112 and a Si1-xGex material 114 as shown. For the embodiments of FIGS. 1-5, the Si material 112 of the first projection 108 defines a Si fin 111, and the Si1-xGex material 114 of the first projection 108 is disposed on three sides of the exposed portion of the Si fin. According to an embodiment, the Si1-xGex material 112 may be epitaxially grown on the Si fin 111 only in pMOS regions in a well known manner. Optionally, a cap, such as a Si cap (not shown), can be grown in a conventional manner on top of the Si1-xGex material 112 as a sacrificial protective layer.

Referring next to FIG. 3, a method according to an embodiment includes exposing the projection 108 to preferential oxidation to yield a second projection 116 including a center region 118 and a covering region 120. In the shown embodiment, the center region 118 comprises a Ge/Si1-yGey fin 122, and the covering region 120 comprises SiO2. Preferential oxidation according to embodiments includes an oxidation process where Si is predominantly consumed to form SiO2, and where Ge is pushed into the center region 118 and interacts with the Si material 112 (FIG. 1) to form Ge/Si1-yGey, preferential oxidation therefore directly converting the first projection 108 into the second projection 124. In the stage shown in FIG. 3, where the contemplated end product for the structure includes a multi-gate transistor (such as, for example, shown in FIG. 4 described below) the preferential oxidation is performed until the Ge/Si1-yGey forms a fin of a desired configuration and dimensions. The preferential oxidation parameters may be chosen according to application needs, and may be empirically determined to arrive at the desired Ge/Si1-yGey fin, such as fin 122. A selection of process parameters for the preferential oxidation would be a function of a number of factors, such as, for example, the desired dimensions and composition of the fin 122, as would be recognized by one skilled in the art. For example, to obtain a pure crystalline Ge fin having a width of about 10 nm, an embodiment may involve using a Si fin 111 having a thickness of about 20 nm, and a Si1-xGex material 114 having a thickness of about 20-40 nm and having a composition of about 10-20 atomic % to about 40 atomic % Ge. Where the fin 122 is desired to include a Si1-yGey material, the Si1-xGex material may have a lower atomic percentage of Ge, such as, for example, less than about 20 atomic % Ge. Examples of temperature ranges for preferential oxidation to yield the embodiment of FIG. 3 may include temperatures between about 900 degrees Celsius to about 1100 degrees Celsius. Examples of oxidation time ranges may include oxidation times between about 10 minutes and about 1 hour. The above-mentioned parameters are merely exemplary, however, and it is to be understood that embodiments encompass other parameters as would be within the knowledge of one skilled in the art.

As next seen in FIG. 4, according to a first embodiment, a method comprises selectively removing the covering region 120 of FIG. 3 to expose the Ge/Si1-yGey fin 122. According to an embodiment, selectively removing the covering region 120 may include exposing the covering region 120 to a wet etch, such as, for example, a HF wet etch or a combination of wet/dry etches, as would be readily recognized by one skilled in the art. Removal of the covering region 120 yields a transistor structure 100 as shown, where the fin 122 includes a uniaxially compressively strained Ge/Si1-yGey material as a result of the hetero-epitaxial coherency in the interface between the lower Si substrate 104 and the fin 122. The shown structure 100 in FIG. 3 is adapted for further processing according to known process flows to yield a multigate transistor by way of the formation thereon of a high k gate dielectric, a metal gate, spacers, source and drain contacts, isolation regions and interconnects as would be recognized by one skilled in the art.

FIG. 5 on the one hand, and 6 and 7 on the other hand, show stages for forming vertically stacked multilevel devices using preferential oxidation according to respective second and third method embodiments.

Referring next to FIG. 5, according to a second embodiment, the exposure to preferential oxidation described with respect to FIG. 3 above may be continued for a longer period of time such that a second projection 124 includes a center region 126 and a covering region 128, where the center region 126 includes a floating Ge/Si1-yGey nanowire channel 130, and the covering region 128 comprises an SiO2 insulation covering 129 surrounding the floating nanowire channel 130 and electrically insulating the same. According to the method embodiment of FIG. 5, due to the faceted growth of Si1-xGex on the sidewalls of the Si fin 111 of FIG. 2, preferential oxidation may completely convert the bottom boundary of the Si fin 111 to SiO2, such that the Ge/Si1-yGey nanowire core becomes floating in the second projection 124 and electrically isolated inside the same, thus forming an insulated Ge nanowire channel. Optionally, according to the third method embodiment of FIG. 5, prior to provision of the Si1-xGex layer 114 on the Si fin 111 (FIGS. 1 and 2), a portion of the Si fin may be anchored on both ends thereof in order to later form source and drain contacts therefrom. Anchoring may involve masking off, by way of hard mask, a portion of the Si fin 111 on both ends to prevent the epitaxial growth and oxidation of $Si_{1-x}Ge_x$ thereon. After oxidation, the hard mask may be removed to allow the masked off portions to be later used as source and drain regions 114. In the stage shown in FIG. 5, where the contemplated end product for the structure includes a nanowire transistor, the preferential oxidation is performed until the $Ge/Si_{1-y}Ge_y$ forms a nanowire channel of a desired configuration and dimensions. The preferential oxidation parameters may be chosen according to application needs, and may be empirically determined to arrive at the desired $Ge/Si_{1-y}Ge_y$ nanowire channel, such as nanowire channel 130. A selection of process parameters for the preferential oxidation would be a function of a number of factors, such as, for example, the desired dimensions and composition of the nanowire 130, as would be recognized by one skilled in the art. For example, to produce a nanowire having a diameter of between about 5 to about 50 nm, the structure of FIG. 1/2 may be exposed to preferential oxidation for a time between about 4 minutes to about 50 minutes. Exposure to preferential oxidation as depicted in FIG. 5 yields a transistor structure 200 as shown, which structure 200 is adapted for further processing according to known process flows to yield a multigate transistor by way of the formation thereon of a high k gate dielectric, a metal gate, spacers, source and drain contacts, isolation regions and interconnects as would be recognized by one skilled in the art.

Referring now to FIGS. 6 and 7, stages of a third method embodiment are shown. These figures will be described in detail below.

In FIG. 6, according to the third method embodiment, providing a first projection includes growing a $Si/Si_{1-x}Ge_x$ superlattice on the lower Si substrate 104 in a well known manner, and creating a $Si/Si_{1-x}Ge_x$ fin 132 from the superlattice, the first projection 133 including the fin 132. The $Si/Si_{1-x}Ge_x$ superlattice may be grown, for example, by way of blanket deposition of the interleaving Si and $Si_{1-x}Ge_x$ layers, followed by etch back to provide the STI regions and the fin 132, followed by backfilling with an oxide material at each side of the fin 132, followed by recessing of the oxide at the sides of the fin to arrive at the structure shown in FIG. 6 including oxide layer 106. The superlattice fin 132 includes interleaving Si layers 134 and $Si_{1-x}Ge_x$ layers 136 as shown. Optionally, the fin 132 may be created by way of lithography in a well known manner.

Referring now to FIG. 7, according to the third method embodiment, exposing the first projection to preferential oxidation is effected to yield a structure 300 comprising a second projection 138 which includes a multilevel core structure, a center region 140 of which includes a plurality of center subregions 142 comprising respective floating nanowires 144, and a covering region 146 of which includes a $SiO_2$ insulation covering 148 surrounding the nanowires 144 and electrically insulating each of the same. In such an instance, the nanowires retain their crystalline structure, while the $SiO_2$ layers become the insulating layers of a multilevel transistor/memory cell. Where the contemplated end product for the structure 300 shown in FIG. 7 is a multilevel memory cell, the interleaving $SiO_2$ insulation covering 148 constitutes the tunnel oxide of the cell. Where, on the other hand, it is contemplated that the structure 300 of FIG. 7 result in an end product including a multilevel transistor, an embodiment contemplates removing the $SiO_2$ insulation covering 148, such as by way of using a wet etch or a combination of wet/dry etches. In such a case, a high k dielectric layer and a metal gate may be formed around each of the nanowires 144, and source and drain contacts and interconnects may further be provided in a well known manner to form a transistor structure, where the nanowires 144 would constitute nanowire channels. Thus, structure 300 of FIG. 7 is adapted to be further processed to provide either a multilevel memory device or a multilevel logic device according to application needs.

It is noted that, although the starting structure in FIGS. 1/2 to arrive at the embodiments of either of FIGS. 3/5 is a structure including a bulk silicon substrate, the resulting structures are not so limited. For example, embodiments including within their scope the structure of FIG. 3 that is situated on an insulator structure to yield a SOI device. In addition, the embodiment of FIG. 5 effectively provides a SOI structure by virtue of the presence of the $SiO_2$ insulation covering 129.

A common structural feature between the embodiments of FIGS. 3, 5 and 7 according to embodiments is the fact that, in all of those embodiments, is that both the center region and the interface between the center region and the covering region is a perfect crystal, that is, a crystalline material with substantially no dislocation defects. In addition, a common structural feature between the embodiments of FIGS. 5 and 7 is the pointed region P of the lower bulk Si substrate 104 as shown. The pointed region P results in FIG. 5 from a separation of the nanowire channel 130 from the bulk Si substrate 104 during extended preferential oxidation, or, in FIG. 7, from a separation of the floating nanowire 144 closest to the lower bulk Si substrate 104 from the lower bulk Si substrate 104, such separation thus leaving the pointed region P in its wake.

It is noted that, although the figures show a single second projection extending above the insulating layer, embodiments are not so limited, and comprise within their scope the provision, on the same device, of arrays of second projections each having any of the configurations of FIGS. 3, 5 and/or 7 according to application needs.

Advantageously, embodiments provide a novel method of directly converting a Si fin region into one or more $Ge/Si_{1-y}Ge_y$ regions which may be configured to serve as either transistor channels (either in the form of fins or in the form of single level or multi-level nanowires) or memory cell nanowires. The $Ge/Si_{1-y}Ge_y$ regions are advantageously more compatible to mid gap work function metals with respect to Si. Method embodiments provide structures that are advantageously adapted to be processed according to well known formation methods to create transistors or memory cells according to application needs. Transistors formed according to embodiments are further advantageously easily integratable with strain Si nMOS multigate transistors to form high performance cMOS multigate transistors, and are advantageously compatible to well known high k/metal gate integration. In addition, advantageously, embodiments result in multigate and/or nanowire structures that are self-aligned with respect to the STI regions, to the extent that those structures are brought into being from a structure that is originally part of the underlying silicon layer as seen in FIG. 2 or 6. Moreover, embodiments allow the provision of a SOI nanowire structure (such as that shown in FIG. 5) that is self-aligned without the need for the provision of expensive SOI underlying structures, to the extent that embodiments allow the creation of a self-aligned oxide layer (129 in FIG. 5) between the underlying silicon layer and the nanowire channel.

Figure 8:
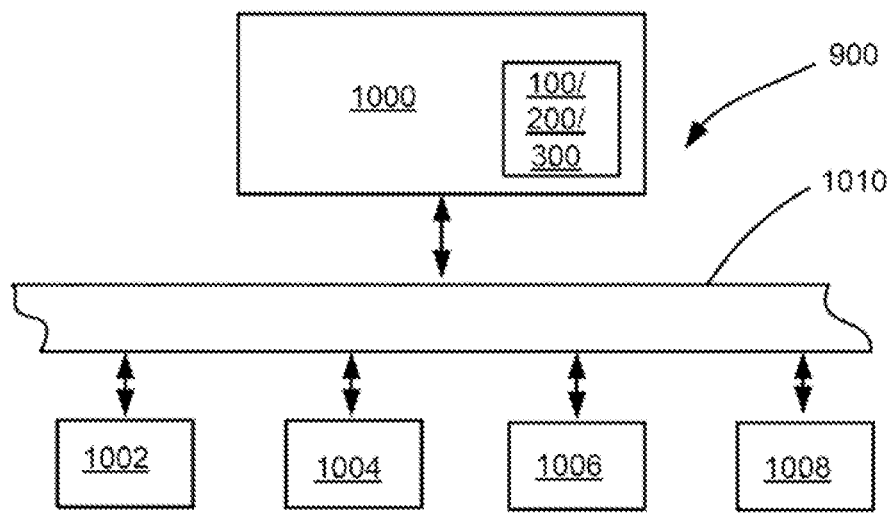
FIG. 8 is a schematic view of an embodiment of a system incorporating a structure as depicted in either of FIGS. 4, 5 and 7.

Referring to FIG. 8, there is illustrated one of many possible systems 900 in which embodiments of the present invention may be used. In one embodiment, the electronic assembly 1000 may include a transistor structure such as any of structures 100, 200 or 300 of FIGS. 4, 5 and 7, respectively.

Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 8, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM), non-Volatile memory (FLASH, EPROM), and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A method to form a microelectronic structure, comprising:
   providing a substrate including a lower Si substrate and an insulating layer on the substrate;
   forming a projection on the substrate projecting above the insulating layer comprising a plurality of interleaved $Si_{1-x}Ge_x$ and Si layers; and
   oxidizing the projection to form a plurality of nanowires and an insulation covering, wherein the insulation covering is a single structure surrounding each of the plurality of nanowires.

2. The method of claim 1, wherein oxidizing the projection comprises oxidizing the projection to form a plurality of nanowires surrounded by a $SiO_2$ insulation covering.

3. The method of claim 1, wherein providing the substrate including a lower Si substrate and an insulating layer on the substrate and forming the projection comprises:
   providing a Si substrate;
   blanket depositing interleaved $Si_{1-x}Ge_x$ and Si layers on the Si substrate;
   etching the interleaved $Si_{1-x}Ge_x$ and Si layers and the Si substrate to from the projection and form recesses in the Si substrate;
   backfilling an insulation material at opposing side of the projection; and
   recessing the insulation material to form the insulating layer.

4. The method of claim 1, further comprising forming a nanowire transistor on the substrate comprising a high k gate dielectric, a metal gate, spacers, source and drain contacts, isolation regions and interconnects.

5. The method of claim 4, further comprising forming a multilevel memory cell comprising a control gate, spacers, source, and drain contacts and interconnects.

\* \* \* \* \*